US012635254B2

(12) United States Patent
Zhao et al.

(10) Patent No.: US 12,635,254 B2
(45) Date of Patent: May 19, 2026

(54) DEVICE INTEGRATING TRENCH TYPE POWER DEVICE AND SOURCE CAPACITOR AND MANUFACTURING METHOD THEREOF

(71) Applicant: CHONGQING ALPHA AND OMEGA SEMICONDUCTOR LIMITED, Chongqing (CN)

(72) Inventors: Yi Zhao, Chongqing (CN); Liang Shi, Chongqing (CN)

(73) Assignee: CHONGQING ALPHA AND OMEGA SEMICONDUCTOR LIMITED, Chongqing (CN)

( * ) Notice: Subject to any disclaimer, the term of this patent is extended or adjusted under 35 U.S.C. 154(b) by 511 days.

(21) Appl. No.: 18/316,245

(22) Filed: May 12, 2023

(65) Prior Publication Data

US 2023/0282636 A1     Sep. 7, 2023

Related U.S. Application Data

(63) Continuation of application No. PCT/CN2021/125673, filed on Oct. 22, 2021.

(30) Foreign Application Priority Data

Nov. 12, 2020     (CN) .......................... 202011262093.7

(51) Int. Cl.
*H10D 89/60*      (2025.01)
*H10D 84/01*      (2025.01)
*H10D 84/03*      (2025.01)

(52) U.S. Cl.
CPC ......... *H10D 89/611* (2025.01); *H10D 84/013* (2025.01); *H10D 84/0149* (2025.01); *H10D 84/038* (2025.01)

(58) Field of Classification Search
CPC .............. H10D 89/611; H10D 84/013; H10D 84/0149; H10D 84/038; H10D 84/148;
(Continued)

(56) References Cited

U.S. PATENT DOCUMENTS

| | | | | | |
|---|---|---|---|---|---|
| 6,323,518 | B1 * | 11/2001 | Sakamoto et al. | ...... | H01L 23/62 257/330 |
| 2003/0011032 | A1 * | 1/2003 | Umebayashi | ........ | H10B 12/053 257/E21.655 |

(Continued)

FOREIGN PATENT DOCUMENTS

| | | |
|---|---|---|
| CN | 101083265 A | 12/2007 |
| CN | 101667574 A | 3/2010 |
| CN | 104576532 A | 4/2015 |
| CN | 108389858 A | 8/2018 |
| CN | 112382613 A | 2/2021 |

OTHER PUBLICATIONS

International Search Report issued in corresponding International application No. PCT/CN2021/125673, mailed Jan. 26, 2022.
(Continued)

*Primary Examiner* — Jessica S Manno
*Assistant Examiner* — Sandra Milena Rodriguez Villanu

(57) ABSTRACT

A device integrating a trench type power device and a source capacitor and a manufacturing method of the device integrating the trench type power device and the source capacitor are provided, which relate to a technical field of manufacturing power semicondutor devices. The manufacturing method includes steps of preparing a cellular structure, preparing contact holes and tungsten bolts, accessing an electro-static discharge (ESD) diode and an integrated capacitor into the trench type power device, and depositing a passivation layer, etching a pad region, and performing wire bonding, which integrates the trench type power device and the source capacitor. Since no other masks are additionally added, a cost of the trench type power device and the manufacturing method thereof is controllable, and the (Continued)

device integrating the trench type power device and the source capacitor reduces use of external capacitors, thereby reducing an occupied area of a printed circuit board.

9 Claims, 7 Drawing Sheets

(58) Field of Classification Search
CPC .. H10D 1/692; H10D 30/0297; H10D 30/668;
H10D 84/141; H10D 84/811; H10D 1/68;
H10D 84/016; H10D 1/60; H10D 89/60;
H10D 89/601; H10D 89/911; H10D
84/403; H10D 84/00; H10D 8/022; H10D
84/158; H01L 23/60
See application file for complete search history.

(56) References Cited

U.S. PATENT DOCUMENTS

| | | | |
|---|---|---|---|
| 2007/0281418 A1* | 12/2007 | Hu ........................ | H10D 84/811 |
| | | | 257/E21.011 |
| 2015/0250058 A1* | 9/2015 | Ramachandran et al. ................... | |
| | | | H05K 1/185 |
| | | | 361/748 |
| 2016/0091713 A1* | 3/2016 | Sasagawa ........... | B81C 1/00952 |
| | | | 345/206 |

OTHER PUBLICATIONS

Written Opinion of the International Search Authority in corresponding International application No. PCT/CN2021/125673.

* cited by examiner

DEVICE INTEGRATING TRENCH TYPE POWER DEVICE AND SOURCE CAPACITOR AND MANUFACTURING METHOD THEREOF

TECHNICAL FIELD

The present disclosure relates to a technical field of manufacturing power semicondutor devices, and in particular to a device integrating a trench type power device and a source capacitor and a manufacturing method of the device integrating the trench type power device and a source capacitor.

BACKGROUND

Trench type power devices are widely applied to a field of power management due to advantages of low on-resistance, high integration level, etc. In a design for specific application circuit of the trench type power devices, a source end of a circuit is generally connected in series with a capacitor element to achieve a purpose of filtering and rectifying. In particular, a capacitor is generally welded on a printed circuit board, and is connected to a power device through a printed circuit board wire.

Chinese patent having publication number of CN102255527B provides a novel microwave intermodulation rectifier circuit, which prints a microstrip rectifier circuit on a single-layer double-sided printed circuit board, and bottom surfaces of the novel microwave intermodulation rectifier circuit are earth plates. A microwave source is input and connected to a DC blocking capacitor, a diode rectifier microstrip circuit is partially connected between the DC blocking capacitor and parallel ground capacitor I. An output end branches two paths, one path is output to a direct current (DC) load I, and another path enters a recovery branch through a band-pass filtering circuit. A rectifier part of the recovery branch is connected between the band-pass filtering circuit and a parallel ground capacitor II, and the recovery branch is output to a DC load II. A problem of low-frequency energy loss caused by factors, such as intermodulation, is solved by using an intermodulation frequency recovery branch, which effectively overcomes a disadvantage of conventional rectifier circuits on intermodulation effect, and further improves conversion efficiency of radio frequency energy to direct current.

However, current printed circuit boards generally have a relatively large area for connecting external capacitors, which increases costs and is not conductive to miniaturization and integration of electronic devices.

SUMMARY

In order to overcome defects in the prior art, the present disclosure aims to provide a device integrating a trench type power device and a source capacitor and a manufacturing method of the device integrating the trench type power device and a source capacitor.

The present disclosure is achieved by following technical solutions of a manufacturing method of a device integrating a trench type power device and a source capacitor, including:

step A, preparing a cellular structure;

step B, preparing contact holes and tungsten bolts;

step C, accessing an electro-static discharge (ESD) diode and an integrated capacitor into the trench type power device; and step D, depositing a passivation layer, etching a pad region, and performing wire bonding.

Furthermore, the step A specifically includes:

step S1, performing chemical vapor deposition on an upper surface of a silicon substrate with epitaxial layers, where each of the epitaxial layers are doped with trivalent elements and pentavalent elements;

step S2, depositing a mask on an upper surface of each of the epitaxial layers, where a component of the mask is silicon dioxide, and a preparation method of the mask includes a low-temperature chemical vapor deposition method or a high-temperature furnace tube thermal oxidation method;

step S3, spin-coating a photoresist on an upper surface of the mask, defining trench patterns through exposure of a photoetching machine, and forming a circuit pattern on the mask, where the trench patterns include a lower polar plate trench pattern, a cellular gate trench pattern, and an interconnection gate trench pattern of the integrated capacitor, a critical dimension of the lower polar plate trench pattern of the integrated capacitor is greater than a critical dimension of the interconnection gate trench pattern of the integrated capacitor, and the critical dimension of the interconnection gate trench pattern of the integrated capacitor is greater than a critical dimension of the cellular gate trench pattern of the integrated capacitor;

step S4, after forming the circuit pattern on the mask, transferring the circuit pattern onto the silicon substrate through dry etching, and removing the photoresist and the mask through wet drying; performing etching to obtain a lower polar plate trench, an interconnection gate trench, and a cellular gate trench, where a depth of the lower polar plate trench is greater than a depth of the interconnection gate trench, and the depth of the interconnection gate trench is greater than a depth of the cellular gate trench;

step S5, growing a sacrificial oxide layer on a sidewall of each of the lower polar plate trench, the interconnection gate trench, and the cellular gate trench through a high-temperature furnace tube thermal oxidation method;

step S6, removing the sacrificial oxide layer through the wet etching, and growing a gate oxide layer through the high-temperature furnace tube thermal oxidation method;

step S7, depositing one layer of polysilicon on the lower polar plate trench, the interconnection gate trench, the cellular gate trench, and the silicon substrate through low-pressure chemical vapor deposition, and doping the pentavalent elements or the trivalent elements, where when the pentavalent elements are doped, the pentavalent elements are doped in a deposition process, when the trivalent elements are doped, the trivalent elements are doped through ion implantation after a gate is formed;

step S8, removing a part of the polysilicon above an upper opening of each of the lower polar plate trench, the interconnection gate trench, and the cellular gate trench through chemical mechanical polishing or the dry etching;

step S9, growing a silicon dioxide-silicon nitride-silicon dioxide composite thin film on an upper surface of the gate oxide layer or the polysilicon through the high-temperature furnace tube thermal oxidation method;

step S10, depositing one layer of intrinsic polysilicon on an upper surface of the silicon dioxide-silicon nitride-silicon dioxide composite thin film through the low-pressure chemical vapor deposition, doping a first impurity through the ion implantation, the first impurity doped through the ion implantation includes the pentavalent elements or the trivalent elements;

step S11, defining an ESD diode region pattern and an integrated capacitor upper polar plate region circuit pattern through a photoetching method, where the ESD diode region pattern is located above the cellular gate trench and the interconnection gate trench, and the integrated capacitor upper polar plate region circuit pattern is located above the lower polar plate trench of the integrated capacitor;

step S12, transferring the ESD diode region pattern and the integrated capacitor upper polar plate region circuit pattern onto the silicon substrate through the dry etching, removing redundant silicon dioxide-silicon nitride-silicon dioxide composite thin film and redundant photoresist;

step S13, forming a transistor body region through the ion implantation by doping a second impurity, and activating the second impurity doped in the transistor body region through high-temperature thermal annealing, where the second impurity doped through the ion implantation the trivalent elements or the pentavalent elements; and step S14, simultaneously defining two transistor cellular source regions, ESD diode regions, and an integrated capacitor upper polar plate region through the photoetching method, doping a third impurity in the two transistor cellular source regions, the ESD diode regions, and the integrated capacitor upper polar plate region through the ion implantation, then removing the photoresist and activating the third impurity doped in the two transistor cellular source regions, the ESD diode regions, and the integrated capacitor upper polar plate region through the high-temperature thermal annealing to finally obtain the cellular structure, where the third impurity includes the trivalent elements or the pentavalent elements, the two transistor cellular source regions are located at two sides of the cellular gate trench, the ESD diode regions are disposed in an ESD region at intervals, the integrated capacitor upper polar plate region is disposed on an upper surface of the silicon dioxide-silicon nitride-silicon dioxide composite thin film above the lower polar plate trench.

Furthermore, in the step S1, the step S7, the step S10, and the step S13, and the step S14, the trivalent elements include boron element, and the pentavalent elements include arsenic element and phosphorus element.

Furthermore, a polarity of the third impurity doped through the ion implantation in the step S14 is opposite to a polarity of the first impurity doped through the ion implantation in the step S10, and a PN junction diode is formed in the ESD region.

Furthermore, a thickness of the sacrificial oxide layer in the step S5 is 10-100 nm, a thickness of the gate oxide layer in the step S6 is 10-100 nm; a thickness of the polysilicon in the step S7 is 500-1000 nm, and a thickness of the silicon dioxide-silicon nitride-silicon dioxide composite thin film in the step S9 is 100-2000 nm.

Furthermore, the step B specifically includes:

step S15, forming a silicon dioxide interlayer dielectric layer through chemical vapor deposition, where the silicon dioxide interlayer dielectric layer is capable of being doped with boron-phosphorus impurities for improving fluidity and foreign impurity adsorbability of the silicon nitride thin film;

step S16, configuring the photoetching method to define patterns of two source region trench contact holes, a pattern of an interconnection gate contact hole, patterns of ESD diode end contact holes, a pattern of an integrated capacitor lower polar plate contact hole, and a pattern of an integrated capacitor upper polar plate contact hole, where the contact holes include the two source region trench contact holes, the interconnection gate contact hole, the ESD diode end contact holes, the integrated capacitor lower polar plate contact hole, and the integrated capacitor upper polar contact hole, the patterns of the two source region trench contact holes are respectively located above the two transistor cellular source regions, the pattern of the interconnection gate contact hole is located above the interconnection gate trench, and the patterns of the ESD diode end contact holes are respectively located above two ends of each of the ESD diode regions, the pattern of the integrated capacitor lower polar plate contact hole is located above one side of the lower polar plate trench of the integrated capacitor close to the cellular gate trench, and the pattern of the integrated capacitor upper polar plate contact hole is located above the integrated capacitor upper polar plate region;

step S17, etching the silicon dioxide interlayer dielectric layer through the dry etching to transfer the patterns of the two source region trench contact holes, the pattern of the interconnection gate contact hole, the patterns of the ESD diode end contact holes, the pattern of the integrated capacitor lower polar plate contact hole, and the pattern of the integrated capacitor upper polar contact hole onto the silicon substrate;

step S18, doping a fourth impurity having high concentration to a bottom of each of the two source region trench contact holes, the interconnection gate contact hole, the ESD diode end contact holes, the integrated capacitor lower polar plate contact hole, and the integrated capacitor upper polar contact hole, forming an ohmic contact of each of the two source region trench contact holes, the interconnection gate contact hole, the ESD diode end contact holes, the integrated capacitor lower polar plate contact hole, and the integrated capacitor upper polar contact hole through activating the fourth impurity through rapid thermal annealing; and step S19, depositing metal titanium at the bottom of each of the two source region trench contact holes, the interconnection gate contact hole, the ESD diode end contact holes, the integrated capacitor lower polar plate contact hole, and the integrated capacitor upper polar contact hole through a physical vapor deposition method, configuring titanium nitride as a bounding layer, forming silicide through rapid thermal degradation, then depositing metal tungsten, removing a part of the metal tungsten other than the two source region trench contact holes, the interconnection gate contact hole, the ESD diode end contact holes, the integrated capacitor lower polar plate contact hole, and the integrated capacitor upper polar contact hole through the dry etching, and forming each of the tungsten bolts in each of the two source region trench contact holes, the interconnection gate contact hole, the ESD diode end contact holes, the integrated capacitor lower polar plate contact hole, and the integrated capacitor upper polar contact hole.

Furthermore, a polarity of the fourth impurity doped through the ion implantation in the step S18 is same as a polarity of the second impurity doped through the ion implantation in the step S13.

Furthermore, the step C specifically includes:

step S20, depositing metal aluminum copper on each of the tungsten bolts through a magnetron sputtering method, and forming an electric circuit through a photoetching method and dry etching, where a first tungsten bolt in one side of the interconnection gate contact hole distal from the two source region trench contact holes and a second tungsten bolt in one side of each of the ESD diode end contact holes distal from the two source region trench contact holes are connected through the metal aluminum copper, a third tungsten bolt in one side of each of the two source region trench contact holes, a fourth tungsten bolt in one side of each of the ESD diode end contact holes close to the two source region trench contact holes, and a fifth tungsten bolt in the integrated capacitor lower polar plate contact hole are connected through the metal aluminum copper, the metal aluminum copper is deposited above a sixth tungsten bolt in the integrated capacitor upper polar plate contact hole, so as to access the ESD and the integrated capacitor into the trench type power device.

Furthermore, the step D specifically includes:

step S21, depositing the passivation layer, and etching the pad region through a photoetching method and dry etching, where the passivation layer includes silicon nitride or silicon dioxide, then routing on a pad for packaging to complete the wire bonding, so as to complete the manufacturing method. In particular, if the integrated capacitor is not needed here, the wire bonding may still be performed through a source pad.

The present disclosure further provides a device integrating a trench type power device and a source capacitor, and the device integrating the trench type power device and the source capacitor is obtained through the manufacturing method of the device integrating the trench type power device and the source capacitor.

In summary, compared with the prior art, the present disclosure has following beneficial effects:

(1) the present disclosure provides the manufacturing method for integrating the trench type power device and the source capacitor;

(2) since no other masks are additionally added, a cost of the device integrating the trench type power device and the source capacitor and the manufacturing method thereof is controllable; and (3) the device integrating the trench type power device and the source capacitor may reduce use of external capacitors, thereby reducing an occupied area of a printed circuit board, and further achieving purposes of reducing the cost of the device integrating the trench type power device and the source capacitor and miniaturizing the device integrating the trench type power device and the source capacitor.

BRIEF DESCRIPTION OF DRAWINGS

Other features, objects, and advantages of the present disclosure would become more apparent by reading following detailed description of non-limiting embodiments with reference to following drawings.

Figure 1:
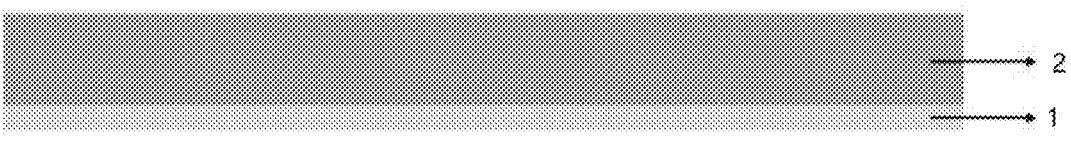
FIG. 1 is a schematic diagram of epitaxial layers after depositing through a technological process in step S1 of a manufacturing method of a device integrating a trench type power device and a source capacitor according to embodiments 1-3 of the present disclosure.

Numerals in the drawings: 1. silicon substrate; 2. epitaxial layer; 3. mask; 4. cellular gate trench; 5. interconnection gate trench; 6. lower polar plate trench; 7. sacrificial oxide layer; 8. gate oxide layer; 9. polysilicon; 10. silicon dioxide-silicon nitride-silicon dioxide composite thin film; 11. intrinsic polysilicon; 12. ESD region pattern; 13. integrated capacitor upper polar plate region pattern; 14. transistor body region pattern; 15. transistor cellular source region pattern; 16. ESD diode region; 17. integrated capacitor upper polar plate region; 18. silicon dioxide interlayer dielectric layer; 19. source region trench contact hole; 20. interconnection gate contact hole; 21. ESD diode end contact hole; 22. integrated capacitor lower polar plate contact hole; 23. integrated capacitor upper polar plate contact hole; 24. ohmic contact; 25. bounding layer; 26. metal aluminum copper; 27. passivation layer.

DETAILED DESCRIPTION

Following embodiments would help those who skilled in the art to further understand the present disclosure, but do not limit the present disclosure in any form. Those who skilled in the art may make several changes and improvements without departing from a concept of the present disclosure, all of which fall within the protection scope of the present disclosure. Endpoints and any values of ranges disclosed herein are not limited to this precise range or value, which should be understood to include values close to those ranges or values. For a numerical range, one or more new numerical ranges may be obtained by combining endpoint values of various ranges, combining the endpoint values of various ranges and separate point values, and combining separate point values, which should be considered as disclosed herein, and the present disclosure is described in detail below with reference to specific embodiments.

Embodiment 1

The present disclosure provides a manufacturing method of a device integrating a trench type power device and a source capacitor, including following steps.

In step S1, as shown in FIG. 1, epitaxial layers 2 are grown on a silicon substrate 1, and the epitaxial layers 2 are grown through chemical vapor deposition. The epitaxial layers 2 are capable of being doped with trivalent elements, including boron element, to prepare a P-type device or being doped with pentavalent elements, including arsenic element and phosphorus element, to prepare an N-type device according to different polarities of the device integrating the trench type power device and the source capacitor. In the embodiment, the epitaxial layers 2 are doped with the trivalent elements including the boron element to prepare the P-type device. The epitaxial layers 2 may have micron-level changes in depths according to different operating voltages.

Figure 2:
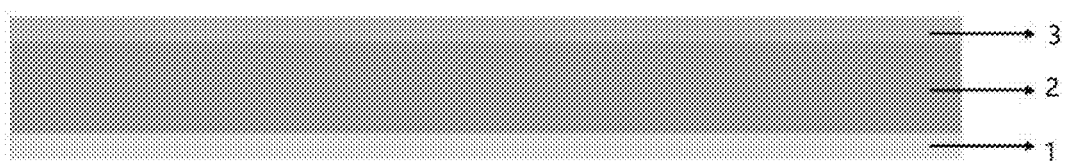
FIG. 2 is a schematic diagram of a mask after depositing through a technological process in step S2 of the manufacturing method of the device integrating the trench type power device and the source capacitor according to embodiments 1-3 of the present disclosure.

In step S2, as shown in FIG. 2, a silicon dioxide thin film is deposited on the silicon substrate 1 as a mask 3 for trench etching, where the mask 3 is prepared by a low-temperature chemical vapor deposition method or a high-temperature furnace tube thermal oxidation method. In the embodiment, the mask 3 is prepared by the low-temperature chemical vapor deposition method.

Figure 3:
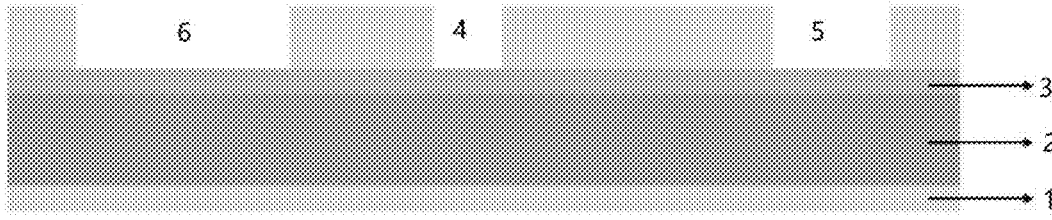
FIG. 3 is a schematic diagram of trenches in a technological process in step S3 of the manufacturing method of the device integrating the trench type power device and the source capacitor according to embodiments 1-3 of the present disclosure.

In step S3, as shown in FIG. 3, a photoresist is spin-coated on an upper surface of the mask 3, trench patterns are defined through exposure of a photoetching machine. In particular, the manufacturing method needs to simultaneously define three trenches including a cellular gate trench 4, an interconnection gate trench 5, and a lower polar plate trench 6. The cellular gate trench 4 is smallest in a critical dimension and is configured to form a gate of a cellular transistor, the interconnection gate trench 5 is relatively large in a critical dimension and is configured to implement a gate interconnection of the cellular transistor, and the lower polar plate trench 6 is largest in a critical dimension and is configured to form a lower polar plate of the integrated capacitor.

Figure 4:
FIG. 4 is a schematic diagram of the trenches after etching through a technological process in step S4 of the manufacturing method of the device integrating the trench type power device and the source capacitor according to embodiments 1-3 of the present disclosure.

In step S4, as shown in FIG. 4, after the circuit pattern is formed on the mask 3, the circuit pattern is transferred onto the silicon substrate 1 through dry etching, and the photoresist and the mask 3 are removed through wet drying. Due to characteristics of the dry etching, the interconnection gate trench 5 and the lower polar plate trench 6 having relatively larger critical dimensions are etched deeper, the cellular gate trench 4 is etched shallow.

Figure 5:
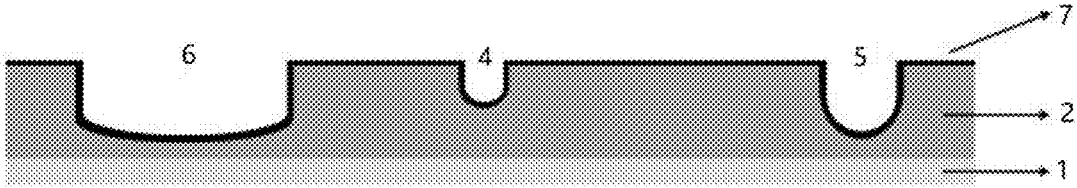
FIG. 5 is a schematic diagram of a sacrificial oxide layer of a technological process in step S5 of the manufacturing method of the device integrating the trench type power device and the source capacitor according to embodiments 1-3 of the present disclosure.

In step S5, as shown in FIG. 5, a sacrificial oxide layer 7 is grown on a sidewall of each of the lower polar plate trench 6, the interconnection gate trench 5, and the cellular gate trench 4 through a high-temperature furnace tube thermal oxidation method. A thickness of the sacrificial oxide layer 7 is 10 nm, and is configured to repair damage on silicon lattice of the sidewall of each of the lower polar plate trench 6, the interconnection gate trench 5, and the cellular gate trench 4 and round the silicon lattice of the sidewall of each of the lower polar plate trench 6, the interconnection gate trench 5, and the cellular gate trench 4.

Figure 6:
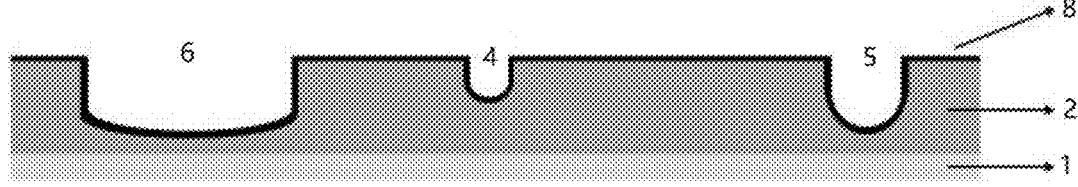
FIG. 6 is a schematic diagram of a gate oxide layer of a technological process in step S6 of the manufacturing method of the device integrating the trench type power device and the source capacitor according to embodiments 1-3 of the present disclosure.

In step S6, as shown in FIG. 6, the sacrificial oxide layer 7 is removed through the wet etching, and a gate oxide layer 8 is grown through the high-temperature furnace tube thermal oxidation method. According to different applications, a thickness of the gate oxide layer is 50 nm.

Figure 7:
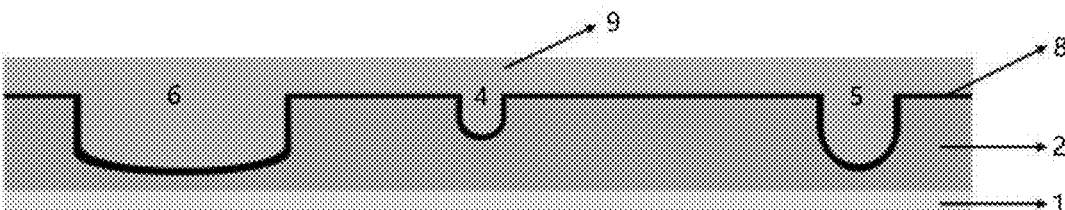
FIG. 7 is a schematic diagram of polysilicon in a technological process in step S7 of the manufacturing method of the device integrating the trench type power device and the source capacitor according to embodiments 1-3 of the present disclosure.

In step S7, as shown in FIG. 7, one layer of polysilicon 9 is deposited on the lower polar plate trench 6, the interconnection gate trench 5, the cellular gate trench 4, and the silicon substrate 1 through low-pressure chemical vapor deposition, a thickness of the one layer of the polysilicon 9 is 800 nm. According to different polarities of the device integrating the trench type power device and the source capacitor, the pentavalent elements are doped in a deposition process, or, the trivalent elements are doped through ion implantation after a gate is formed.

Figure 8:
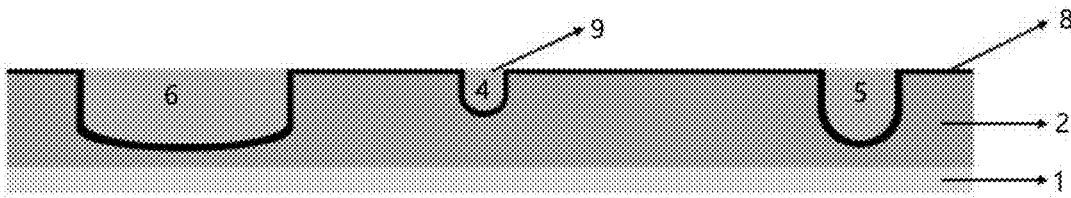
FIG. 8 is a schematic diagram of the trenches after polishing or etching through a technological process in step S8 of the manufacturing method of the device integrating the trench type power device and the source capacitor according to embodiments 1-3 of the present disclosure.

In step S8, as shown in FIG. 8, a part of the polysilicon 9 other than the lower polar plate trench 6, the interconnection gate trench 5, and the cellular gate trench 4 is removed through chemical mechanical polishing or the dry etching.

Figure 9:
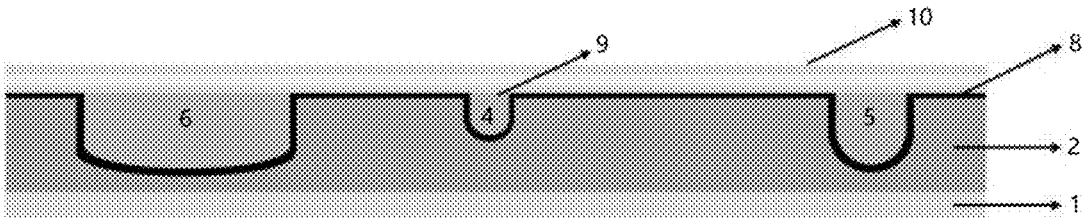
FIG. 9 is a schematic diagram of a silicon dioxide-silicon nitride-silicon dioxide composite thin film in a technological process in step S9 of the manufacturing method of the device integrating the trench type power device and the source capacitor according to embodiments 1-3 of the present disclosure.

In step S9, as shown in FIG. 9, a silicon dioxide-silicon nitride-silicon dioxide composite thin film 10 is grown on an upper surface of the silicon substrate 1 through the high-temperature furnace tube thermal oxidation method, the silicon dioxide-silicon nitride-silicon dioxide composite thin film 10 is not only an insulating layer of an electro-static discharge (ESD) diode, but also a dielectric layer of the integrated capacitor. A thickness of silicon dioxide and a thickness of silicon nitride are adjustable within a range of 100 nm.

Figure 10:
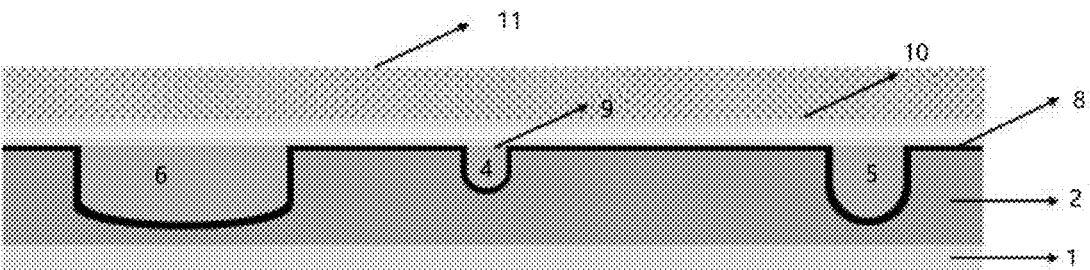
FIG. 10 is a schematic diagram of intrinsic polysilicon in a technological process in step S10 of the manufacturing method of the device integrating the trench type power device and the source capacitor according to embodiments 1-3 of the present disclosure.

In step S10, as shown in FIG. 10, one layer of intrinsic polysilicon 11 is deposited on an upper surface of the silicon dioxide-silicon nitride-silicon dioxide composite thin film 10 through the low-pressure chemical vapor deposition, a first impurity is doped through the ion implantation. According to different polarities of the device integrating the trench type power device and the source capacitor, the first impurity doped through the ion implantation is the arsenic element in the pentavalent elements.

Figure 11:
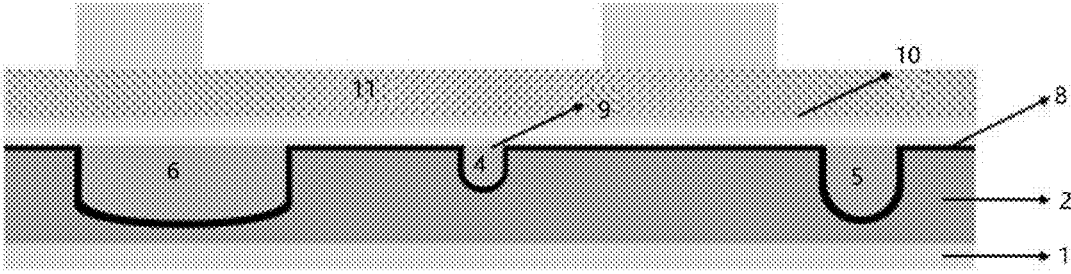
FIG. 11 is a schematic diagram of an ESD diode region pattern and an integrated capacitor upper polar plate region circuit pattern in a technological process in step S11 of the manufacturing method of the device integrating the trench type power device and the source capacitor according to embodiments 1-3 of the present disclosure.

In step S11, as shown in FIG. 11, an ESD diode region pattern 12 and an integrated capacitor upper polar plate region pattern 13 are defined through a photoetching method.

Figure 12:
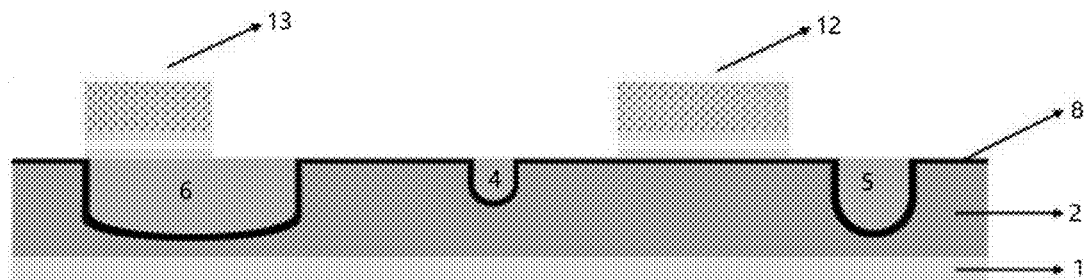
FIG. 12 is a schematic diagram of the ESD diode region pattern and the integrated capacitor upper polar plate region circuit pattern in a technological process in step S12 of the manufacturing method of the device integrating the trench type power device and the source capacitor according to embodiments 1-3 of the present disclosure.

In step S12, as shown in FIG. 12, the ESD diode region pattern 12 and the integrated capacitor upper polar plate region circuit pattern 13 are transferred onto the silicon substrate 1 through the dry etching, and redundant silicon dioxide-silicon nitride-silicon dioxide composite thin film 11 and redundant photoresist are removed.

Figure 13:
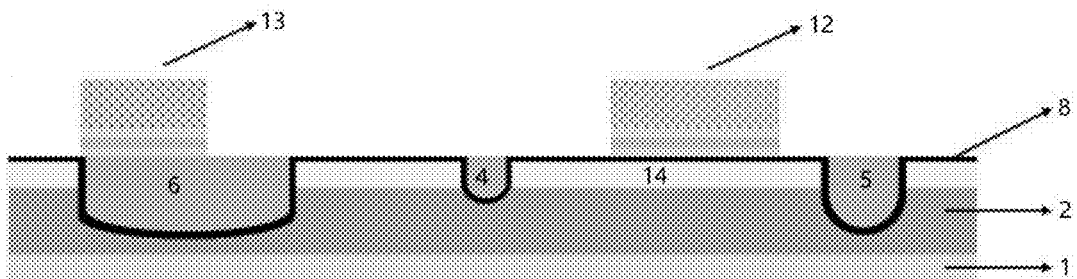
FIG. 13 is a schematic diagram of a transistor body region of a technological process in step S13 of the manufacturing method of the device integrating the trench type power device and the source capacitor according to embodiments 1-3 of the present disclosure.

In step S13, as shown in FIG. 13, a transistor body region 14 is formed through the ion implantation by doping a second impurity, and the second impurity doped in the transistor body region 14 is activated through high-temperature thermal annealing. According to different polarities of the device integrating the trench type power device and the source capacitor, the second impurity doped through the ion implantation is the phosphorus element in the pentavalent elements.

Figure 14:
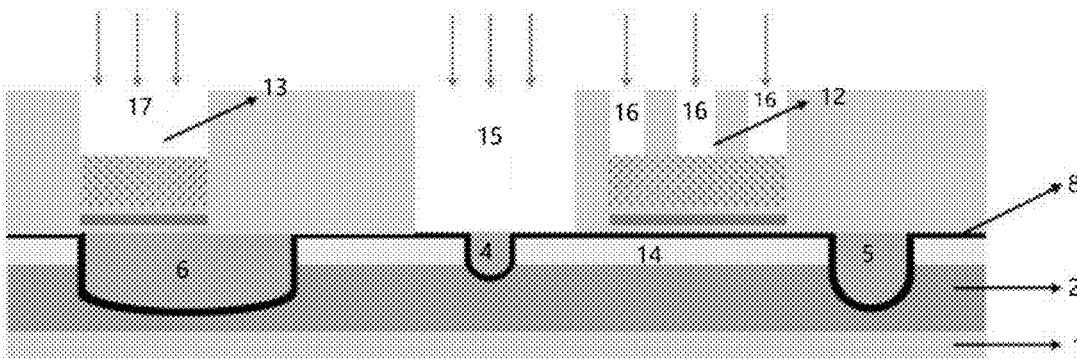
FIG. 14 is a schematic diagram of transistor cellular source regions, ESD diode regions, and an integrated capacitor upper polar plate region after performing a photoetching method through a technological process in step S14 of the manufacturing method of the device integrating the trench type power device and the source capacitor according to embodiments 1-3 of the present disclosure.
Figure 15:
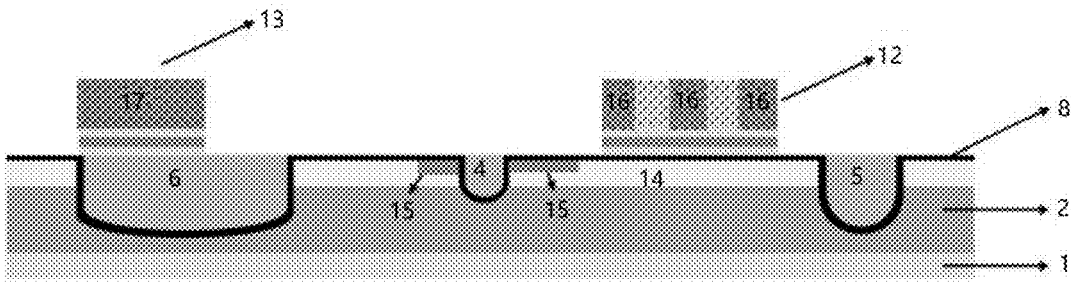
FIG. 15 is a schematic diagram of a cellular in a technological process in step S14 of the manufacturing method of the device integrating the trench type power device and the source capacitor according to embodiments 1-3 of the present disclosure.

In step S14, as shown in FIG. 14, two transistor cellular source regions 15, ESD diode regions 16, and an integrated capacitor upper polar plate region 17 are simultaneously defined through the photoetching method, a third impurity is doped in the two transistor cellular source regions 15, the ESD diode regions 16, and the integrated capacitor upper polar plate region 17 through the ion implantation, then the photoresist is removed and the third impurity doped in the two transistor cellular source regions 15, the ESD diode regions 16, and the integrated capacitor upper polar plate region 17 is activated through the high-temperature thermal annealing, where the third impurity includes the trivalent elements or the pentavalent elements. In particular, a polarity of the third impurity doped through the ion implantation in the step S14 is opposite to a polarity of the first impurity doped through the ion implantation in the step S10, which is convenient for forming a PN junction diode in an ESD region to obtain the cellular structure shown in FIG. 15, and following steps are mainly to isolate the device integrating the trench type power device and the source capacitor from being interconnected with metals.

Figure 16:
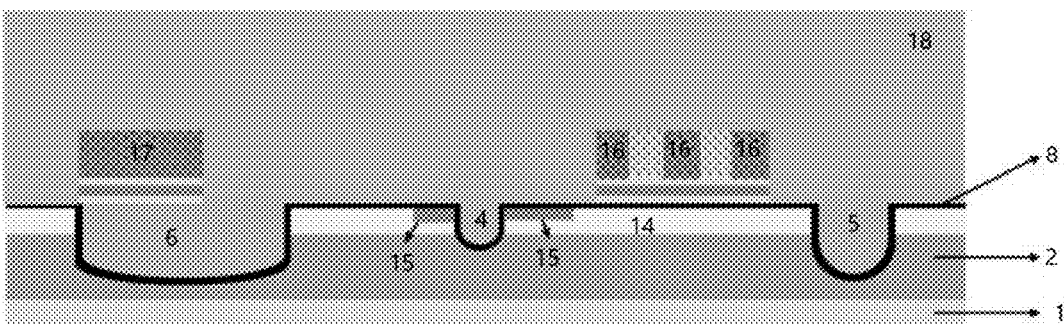
FIG. 16 is a schematic diagram of a silicon dioxide interlayer dielectric layer in a technological process in step S15 of the manufacturing method of the device integrating the trench type power device and the source capacitor according to embodiments 1-3 of the present disclosure.

In step S15, as shown in FIG. 16, a silicon dioxide interlayer dielectric layer 18 is formed through chemical vapor deposition, where the silicon dioxide interlayer dielectric layer 18 is capable of being doped with boron-phosphorus impurities for improving fluidity and foreign impurity adsorbability of the silicon nitride thin film.

Figure 17:
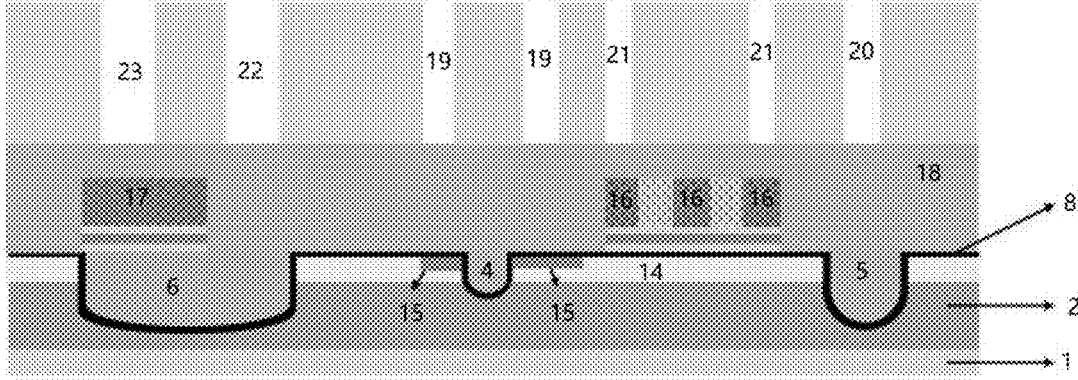
FIG. 17 is a schematic diagram of contact holes in a technological process in step S16 of the manufacturing method of the device integrating the trench type power device and the source capacitor according to embodiments 1-3 of the present disclosure.

In the step S16, as shown in FIG. 17, the photoetching method is configured to define two source region trench contact holes 19, an interconnection gate contact hole 20, ESD diode end contact holes 21, an integrated capacitor lower polar plate contact hole 22, and an integrated capacitor upper polar plate contact hole 23.

Figure 18:
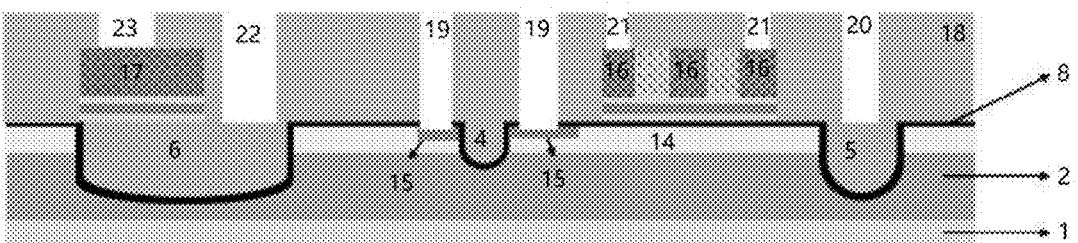
FIG. 18 is a schematic diagram of the contact holes after etching through a technological process in step S17 of the manufacturing method of the device integrating the trench type power device and the source capacitor according to embodiments 1-3 of the present disclosure.

In the step S17, as shown in FIG. 18, the silicon dioxide interlayer dielectric layer 18 is etched through the dry etching to transfer the patterns of the two source region trench contact holes 19, the pattern of the interconnection gate contact hole 20, the patterns of the ESD diode end contact holes 21, the pattern of the integrated capacitor lower polar plate contact hole 22, and the pattern of the integrated capacitor upper polar contact hole 23 onto the silicon substrate 1.

Figure 19:
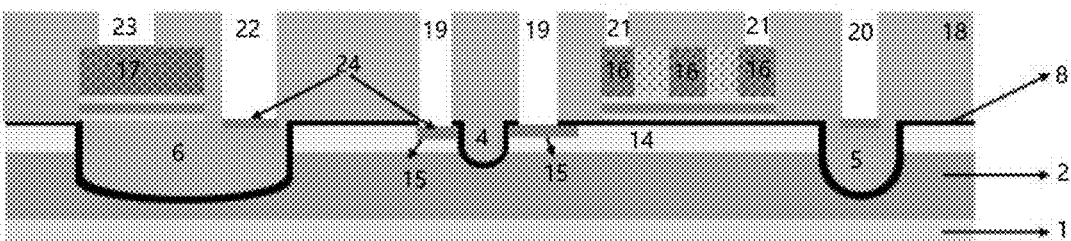
FIG. 19 is a schematic diagram of an ohmic contact in a technological process in step S18 of the manufacturing method of the device integrating the trench type power device and the source capacitor according to embodiments 1-3 of the present disclosure.

In the step S18, as shown in FIG. 19, a fourth impurity having high concentration is doped to a bottom of each of the two source region trench contact holes 19, the interconnection gate contact hole 20, the ESD diode end contact holes 21, the integrated capacitor lower polar plate contact hole 22, and the integrated capacitor upper polar contact hole 23, an ohmic contact 24 of each of the two source region trench contact holes 19, the interconnection gate contact hole 20, the ESD diode end contact holes 21, the integrated capacitor lower polar plate contact hole 22, and the integrated capacitor upper polar contact hole 23 is formed through activating the fourth impurity through rapid thermal annealing. In particular, a polarity of the fourth impurity doped through the ion implantation in the step S18 is the same as a polarity of the second impurity doped in the transistor body region 14 in the step S13.

Figure 20:
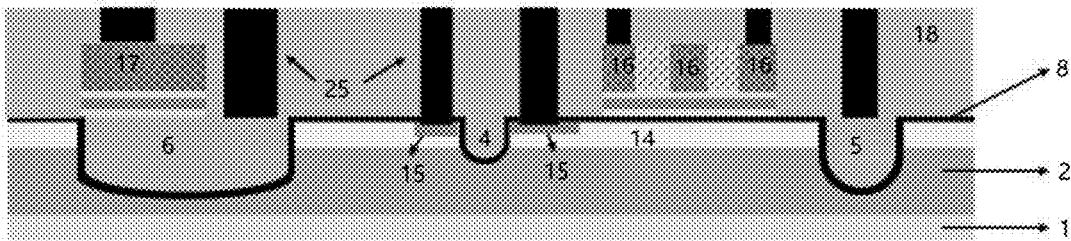
FIG. 20 is a schematic diagram of tungsten bolts in a technological process in step S19 of the manufacturing method of the device integrating the trench type power device and the source capacitor according to embodiments 1-3 of the present disclosure.

In the step S19, as shown in FIG. 20, metal titanium is deposited through a physical vapor deposition method, titanium nitride is configured as a bounding layer 25, silicide is formed through rapid thermal degradation, then metal tungsten is deposited on the silicone substrate 1, a part of the metal tungsten other than the two source region trench contact holes 19, the interconnection gate contact hole 20, the ESD diode end contact holes 21, the integrated capacitor lower polar plate contact hole 22, and the integrated capacitor upper polar contact hole 23 is removed through the dry etching, and each of the tungsten bolts is formed in each of the two source region trench contact holes 19, the interconnection gate contact hole 20, the ESD diode end contact holes 21, the integrated capacitor lower polar plate contact hole 22, and the integrated capacitor upper polar contact hole 23.

Figure 21:
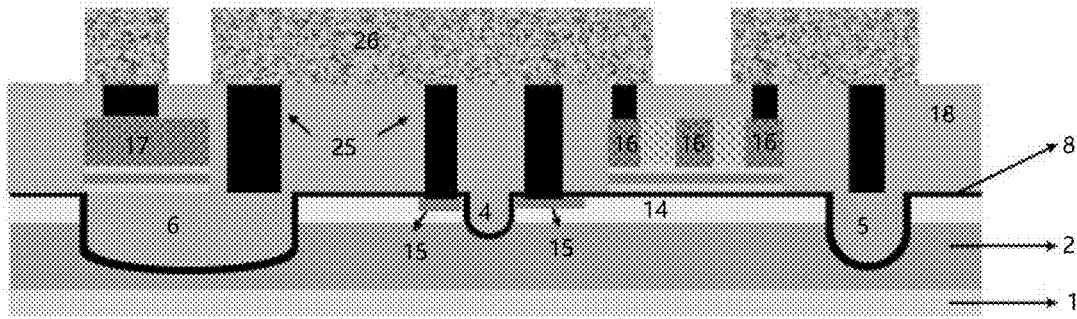
FIG. 21 is a schematic diagram of an electric circuit after performing a photoetching method and dry etching through a technological process in step S20 of the manufacturing method of the device integrating the trench type power device and the source capacitor according to embodiments 1-3 of the present disclosure.

In the step S20, as shown in FIG. 21, metal aluminum copper 26 is deposited on each of the tungsten bolts through a magnetron sputtering method, and an electric circuit is formed through a photoetching method and dry etching, so as to ensure that the ESD diode and the integrated capacitor are accessed into the trench type power device.

Figure 22:
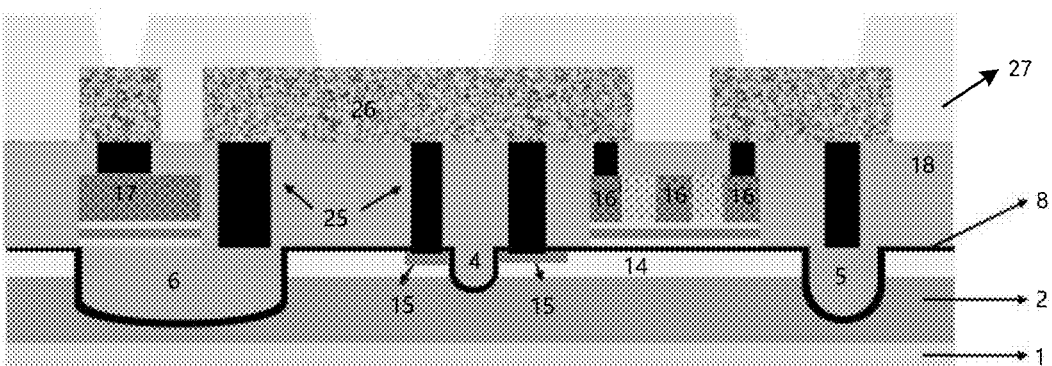
FIG. 22 is a schematic diagram of a device integrating a trench type power device and a source capacitor in a technological process in step S21 of the manufacturing method of the device integrating the trench type power device and the source capacitor according to embodiments 1-3 of the present disclosure.

In the step S21, as shown in FIG. 22, the passivation layer 27 is deposited, and the pad region is etched through a photoetching method and dry etching, where the passivation layer 27 includes silicon nitride or silicon dioxide, then routing on a pad for packaging to complete the wire bonding, so as to complete the manufacturing method. In particular, if the integrated capacitor is not needed here, the wire bonding may still be performed through a source pad.

Embodiment 2

The present disclosure provides a manufacturing method of a device integrating a trench type power device and a source capacitor, including following steps:

In step S1, as shown in FIG. 1, epitaxial layers 2 are grown on a silicon substrate 1, and the epitaxial layers 2 are grown through chemical vapor deposition. The epitaxial layers 2 are capable of being doped with trivalent elements, including boron element, to prepare a P-type device or being doped with pentavalent elements, including arsenic element and phosphorus element, to prepare an N-type device according to different polarities of the device integrating the trench type power device and the source capacitor. In the embodiment, the epitaxial layers 2 are doped with the pentavalent elements including the arsenic element and the phosphorus element to prepare the N-type device. The epitaxial layers 2 may have micron-level changes in depths according to different operating voltages.

In step S2, as shown in FIG. 2, a silicon dioxide thin film is deposited on the silicon substrate 1 as a mask 3 for trench etching, where the mask 3 is prepared by a low-temperature chemical vapor deposition method or a high-temperature furnace tube thermal oxidation method. In the embodiment, the mask 3 is prepared by the high-temperature furnace tube thermal oxidation method.

In step S3, as shown in FIG. 3, a photoresist is spin-coated on an upper surface of the mask 3, trench patterns are defined through exposure of a photoetching machine. In particular, the manufacturing method needs to simultaneously define three trenches including a cellular gate trench 4, an interconnection gate trench 5, and a lower polar plate trench 6. The cellular gate trench 4 is smallest in a critical dimension and is configured to form a gate of a cellular transistor, the interconnection gate trench 5 is relatively large in a critical dimension and is configured to implement a gate interconnection of the cellular transistor, and the lower polar plate trench 6 is largest in a critical dimension and is configured to form a lower polar plate of the integrated capacitor.

In step S4, as shown in FIG. 4, after the circuit pattern is formed on the mask 3, the circuit pattern is transferred onto the silicon substrate 1 through dry etching, and the photoresist and the mask 3 are removed through wet drying. Due to characteristics of the dry etching, the interconnection gate trench 5 and the lower polar plate trench 6 having relatively larger critical dimensions are etched deeper, the cellular gate trench 4 is etched shallow.

In step S5, as shown in FIG. 5, a sacrificial oxide layer 7 is grown on a sidewall of each of the lower polar plate trench 6, the interconnection gate trench 5, and the cellular gate trench 4 through a high-temperature furnace tube thermal oxidation method. A thickness of the sacrificial oxide layer 7 is 50 nm, and is configured to repair damage on silicon lattice of the sidewall of each of the lower polar plate trench 6, the interconnection gate trench 5, and the cellular gate trench 4 and round the silicon lattice of the sidewall of each of the lower polar plate trench 6, the interconnection gate trench 5, and the cellular gate trench 4.

In step S6, as shown in FIG. 6, the sacrificial oxide layer 7 is removed through the wet etching, and a gate oxide layer 8 is grown through the high-temperature furnace tube thermal oxidation method. According to different applications, a thickness of the gate oxide layer is 50 nm.

In step S7, as shown in FIG. 7, one layer of polysilicon 9 is deposited on the lower polar plate trench 6, the interconnection gate trench 5, the cellular gate trench 4, and the silicon substrate 1 through low-pressure chemical vapor deposition, a thickness of the one layer of the polysilicon 9 is 800 nm. According to different polarities of the device integrating the trench type power device and the source capacitor, the pentavalent elements are doped in a deposition process, or, the trivalent elements are doped through ion implantation after a gate is formed.

In step S8, as shown in FIG. 8, a part of the polysilicon 9 other than the lower polar plate trench 6, the interconnection gate trench 5, and the cellular gate trench 4 is removed through chemical mechanical polishing or the dry etching.

In step S9, as shown in FIG. 9, a silicon dioxide-silicon nitride-silicon dioxide composite thin film 10 is grown on an upper surface of the silicon substrate 1 through the high-temperature furnace tube thermal oxidation method, the silicon dioxide-silicon nitride-silicon dioxide composite thin film 10 is not only an insulating layer of an electro-static discharge (ESD) diode, but also a dielectric layer of the integrated capacitor. A thickness of silicon dioxide and a thickness of silicon nitride are adjustable within a range of 1000 nm.

In step S10, as shown in FIG. 10, one layer of intrinsic polysilicon 11 is deposited on an upper surface of the silicon dioxide-silicon nitride-silicon dioxide composite thin film 10 through the low-pressure chemical vapor deposition, a first impurity is doped through the ion implantation. According to different polarities of the device integrating the trench type power device and the source capacitor, the first impurity doped through the ion implantation is the arsenic element in the pentavalent elements.

In step S11, as shown in FIG. 11, an ESD diode region pattern 12 and an integrated capacitor upper polar plate region pattern 13 are defined through a photoetching method.

In step S12, as shown in FIG. 12, the ESD diode region pattern 12 and the integrated capacitor upper polar plate region circuit pattern 13 are transferred onto the silicon substrate 1 through the dry etching, and redundant silicon dioxide-silicon nitride-silicon dioxide composite thin film 11 and redundant photoresist are removed.

In step S13, as shown in FIG. 13, a transistor body region 14 is formed through the ion implantation by doping a second impurity, and the second impurity doped in the transistor body region 14 is activated through high-temperature thermal annealing. According to different polarities of the device integrating the trench type power device and the source capacitor, the second impurity doped through the ion implantation is the phosphorus element in the pentavalent elements.

In step S14, as shown in FIG. 14, two transistor cellular source regions 15, ESD diode regions 16, and an integrated capacitor upper polar plate region 17 are simultaneously defined through the photoetching method, a third impurity is doped in the two transistor cellular source regions 15, the ESD diode regions 16, and the integrated capacitor upper polar plate region 17 through the ion implantation, then the photoresist is removed and the third impurity doped in the two transistor cellular source regions 15, the ESD diode regions 16, and the integrated capacitor upper polar plate region 17 is activated through the high-temperature thermal annealing, where the third impurity includes the trivalent elements or the pentavalent elements. In particular, a polarity of the third impurity doped through the ion implantation in the step S14 is opposite to a polarity of the first impurity doped through the ion implantation in the step S10, which is convenient for forming a PN junction diode in an ESD region to obtain the cellular structure shown in FIG. 15, and following steps are mainly to isolate the device integrating the trench type power device and the source capacitor from being interconnected with metals.

In step S15, as shown in FIG. 16, a silicon dioxide interlayer dielectric layer 18 is formed through chemical vapor deposition, where the silicon dioxide interlayer dielectric layer 18 is capable of being doped with boron-phosphorus impurities for improving fluidity and foreign impurity adsorbability of the silicon nitride thin film.

In the step S16, as shown in FIG. 17, the photoetching method is configured to define two source region trench contact holes 19, an interconnection gate contact hole 20, ESD diode end contact holes 21, an integrated capacitor lower polar plate contact hole 22, and an integrated capacitor upper polar plate contact hole 23.

In the step S17, as shown in FIG. 18, the silicon dioxide interlayer dielectric layer 18 is etched through the dry etching to transfer the patterns of the two source region trench contact holes 19, the pattern of the interconnection gate contact hole 20, the patterns of the ESD diode end contact holes 21, the pattern of the integrated capacitor lower polar plate contact hole 22, and the pattern of the integrated capacitor upper polar contact hole 23 onto the silicon substrate 1.

In the step S18, as shown in FIG. 19, a fourth impurity having high concentration is doped to a bottom of each of the two source region trench contact holes 19, the interconnection gate contact hole 20, the ESD diode end contact holes 21, the integrated capacitor lower polar plate contact hole 22, and the integrated capacitor upper polar contact hole 23, an ohmic contact 24 of each of the two source region trench contact holes 19, the interconnection gate contact hole 20, the ESD diode end contact holes 21, the integrated capacitor lower polar plate contact hole 22, and the integrated capacitor upper polar contact hole 23 is formed through activating the fourth impurity through rapid thermal annealing. In particular, a polarity of the fourth impurity doped through the ion implantation in the step S18 is the same as a polarity of the second impurity doped in the transistor body region 14 in the step S13.

In the step S19, as shown in FIG. 20, metal titanium is deposited through a physical vapor deposition method, titanium nitride is configured as a bounding layer 25, silicide is formed through rapid thermal degradation, then metal tungsten is deposited on the silicone substrate 1, a part of the metal tungsten other than the two source region trench contact holes 19, the interconnection gate contact hole 20, the ESD diode end contact holes 21, the integrated capacitor lower polar plate contact hole 22, and the integrated capacitor upper polar contact hole 23 is removed through the dry etching, and each of the tungsten bolts is formed in each of the two source region trench contact holes 19, the interconnection gate contact hole 20, the ESD diode end contact holes 21, the integrated capacitor lower polar plate contact hole 22, and the integrated capacitor upper polar contact hole 23.

In the step S20, as shown in FIG. 21, metal aluminum copper 26 is deposited on each of the tungsten bolts through a magnetron sputtering method, and an electric circuit is formed through a photoetching method and dry etching, so as to ensure that the ESD diode and the integrated capacitor are accessed into the trench type power device.

In the step S21, as shown in FIG. 22, the passivation layer 27 is deposited, and the pad region is etched through a photoetching method and dry etching, where the passivation layer 27 includes silicon nitride or silicon dioxide, then routing on a pad for packaging to complete the wire bonding, so as to complete the manufacturing method. In particular, if the integrated capacitor is not needed here, the wire bonding may still be performed through a source pad.

Embodiment 3

The present disclosure provides a manufacturing method of a device integrating a trench type power device and a source capacitor, including following steps.

In step S1, as shown in FIG. 1, epitaxial layers 2 are grown on a silicon substrate 1, and the epitaxial layers 2 are grown through chemical vapor deposition. The epitaxial layers 2 are capable of being doped with trivalent elements, including boron element, to prepare a P-type device or being doped with pentavalent elements, including arsenic element and phosphorus element, to prepare an N-type device according to different polarities of the device integrating the trench type power device and the source capacitor. In the embodiment, the epitaxial layers 2 are doped with the pentavalent elements including the phosphorus element to prepare the N-type device. The epitaxial layers 2 may have micron-level changes in depths according to different operating voltages.

In step S2, as shown in FIG. 2, a silicon dioxide thin film is deposited on the silicon substrate 1 as a mask 3 for trench etching, where the mask 3 is prepared by a low-temperature chemical vapor deposition method or a high-temperature furnace tube thermal oxidation method. In the embodiment, the mask 3 is prepared by the low-temperature chemical vapor deposition method.

In step S3, as shown in FIG. 3, a photoresist is spin-coated on an upper surface of the mask 3, trench patterns are defined through exposure of a photoetching machine. In particular, the manufacturing method needs to simultaneously define three trenches including a cellular gate trench 4, an interconnection gate trench 5, and a lower polar plate trench 6. The cellular gate trench 4 is smallest in a critical dimension and is configured to form a gate of a cellular transistor, the interconnection gate trench 5 is relatively large in a critical dimension and is configured to implement a gate interconnection of the cellular transistor, and the lower polar plate trench 6 is largest in a critical dimension and is configured to form a lower polar plate of the integrated capacitor.

In step S4, as shown in FIG. 4, after the circuit pattern is formed on the mask 3, the circuit pattern is transferred onto the silicon substrate 1 through dry etching, and the photoresist and the mask 3 are removed through wet drying. Due to characteristics of the dry etching, the interconnection gate trench 5 and the lower polar plate trench 6 having relatively larger critical dimensions are etched deeper, the cellular gate trench 4 is etched shallow.

In step S5, as shown in FIG. 5, a sacrificial oxide layer 7 is grown on a sidewall of each of the lower polar plate trench 6, the interconnection gate trench 5, and the cellular gate trench 4 through a high-temperature furnace tube thermal oxidation method. A thickness of the sacrificial oxide layer 7 is 100 nm, and is configured to repair damage on silicon lattice of the sidewall of each of the lower polar plate trench 6, the interconnection gate trench 5, and the cellular gate trench 4 and round the silicon lattice of the sidewall of each of the lower polar plate trench 6, the interconnection gate trench 5, and the cellular gate trench 4.

In step S6, as shown in FIG. 6, the sacrificial oxide layer 7 is removed through the wet etching, and a gate oxide layer 8 is grown through the high-temperature furnace tube thermal oxidation method. According to different applications, a thickness of the gate oxide layer is 100 nm.

In step S7, as shown in FIG. 7, one layer of polysilicon 9 is deposited on the lower polar plate trench 6, the interconnection gate trench 5, the cellular gate trench 4, and the silicon substrate 1 through low-pressure chemical vapor deposition, a thickness of the one layer of the polysilicon 9 is 1000 nm. According to different polarities of the device integrating the trench type power device and the source capacitor, the pentavalent elements are doped in a deposition process, or, the trivalent elements are doped through ion implantation after a gate is formed.

In step S8, as shown in FIG. 8, a part of the polysilicon 9 other than the lower polar plate trench 6, the interconnection gate trench 5, and the cellular gate trench 4 is removed through chemical mechanical polishing or the dry etching.

In step S9, as shown in FIG. 9, a silicon dioxide-silicon nitride-silicon dioxide composite thin film 10 is grown on an upper surface of the silicon substrate 1 through the high-temperature furnace tube thermal oxidation method, the silicon dioxide-silicon nitride-silicon dioxide composite thin film 10 is not only an insulating layer of an electro-static discharge (ESD) diode, but also a dielectric layer of the integrated capacitor. A thickness of silicon dioxide and a thickness of silicon nitride are 2000 nm.

In step S10, as shown in FIG. 10, one layer of intrinsic polysilicon 11 is deposited on an upper surface of the silicon dioxide-silicon nitride-silicon dioxide composite thin film 10 through the low-pressure chemical vapor deposition, a first impurity is doped through the ion implantation. According to different polarities of the device integrating the trench type power device and the source capacitor, the first impurity doped through the ion implantation is the phosphorus element in the pentavalent elements.

In step S11, as shown in FIG. 11, an ESD diode region pattern 12 and an integrated capacitor upper polar plate region pattern 13 are defined through a photoetching method.

In step S12, as shown in FIG. 12, the ESD diode region pattern 12 and the integrated capacitor upper polar plate region circuit pattern 13 are transferred onto the silicon substrate 1 through the dry etching, and redundant silicon dioxide-silicon nitride-silicon dioxide composite thin film 11 and redundant photoresist are removed.

In step S13, as shown in FIG. 13, a transistor body region 14 is formed through the ion implantation by doping a second impurity, and the second impurity doped in the transistor body region 14 is activated through high-temperature thermal annealing. According to different polarities of the device integrating the trench type power device and the source capacitor, the second impurity doped through the ion implantation is the trivalent elements including the boron element.

In step S14, as shown in FIG. 14, two transistor cellular source regions 15, ESD diode regions 16, and an integrated capacitor upper polar plate region 17 are simultaneously defined through the photoetching method, a third impurity is doped in the two transistor cellular source regions 15, the ESD diode regions 16, and the integrated capacitor upper polar plate region 17 through the ion implantation, then the photoresist is removed and the third impurity doped in the two transistor cellular source regions 15, the ESD diode regions 16, and the integrated capacitor upper polar plate region 17 is activated through the high-temperature thermal annealing, where the third impurity includes the trivalent elements or the pentavalent elements. In particular, a polarity of the third impurity doped through the ion implantation in the step S14 is opposite to a polarity of the first impurity doped through the ion implantation in the step S10, which is convenient for forming a PN junction diode in an ESD region to obtain the cellular structure shown in FIG. 15, and following steps are mainly to isolate the device integrating the trench type power device and the source capacitor from being interconnected with metals.

In step S15, as shown in FIG. 16, a silicon dioxide interlayer dielectric layer 18 is formed through chemical vapor deposition, where the silicon dioxide interlayer dielectric layer 18 is capable of being doped with boron-phosphorus impurities for improving fluidity and foreign impurity adsorbability of the silicon nitride thin film.

In the step S16, as shown in FIG. 17, the photoetching method is configured to define two source region trench contact holes 19, an interconnection gate contact hole 20, ESD diode end contact holes 21, an integrated capacitor lower polar plate contact hole 22, and an integrated capacitor upper polar plate contact hole 23.

In the step S17, as shown in FIG. 18, the silicon dioxide interlayer dielectric layer 18 is etched through the dry etching to transfer the patterns of the two source region trench contact holes 19, the pattern of the interconnection gate contact hole 20, the patterns of the ESD diode end contact holes 21, the pattern of the integrated capacitor lower polar plate contact hole 22, and the pattern of the integrated capacitor upper polar contact hole 23 onto the silicon substrate 1.

In the step S18, as shown in FIG. 19, a fourth impurity having high concentration is doped to a bottom of each of the two source region trench contact holes 19, the interconnection gate contact hole 20, the ESD diode end contact holes 21, the integrated capacitor lower polar plate contact hole 22, and the integrated capacitor upper polar contact hole 23, an ohmic contact 24 of each of the two source region trench contact holes 19, the interconnection gate contact hole 20, the ESD diode end contact holes 21, the integrated capacitor lower polar plate contact hole 22, and the integrated capacitor upper polar contact hole 23 is formed through activating the fourth impurity through rapid thermal annealing. In particular, a polarity of the fourth impurity doped through the ion implantation in the step S18 is the same as a polarity of the second impurity doped in the transistor body region 14 in the step S13.

In the step S19, as shown in FIG. 20, metal titanium is deposited through a physical vapor deposition method, titanium nitride is configured as a bounding layer 25, silicide is formed through rapid thermal degradation, then metal tungsten is deposited on the silicone substrate 1, a part of the metal tungsten other than the two source region trench contact holes 19, the interconnection gate contact hole 20, the ESD diode end contact holes 21, the integrated capacitor lower polar plate contact hole 22, and the integrated capacitor upper polar contact hole 23 is removed through the dry etching, and each of the tungsten bolts is formed in each of the two source region trench contact holes 19, the interconnection gate contact hole 20, the ESD diode end contact holes 21, the integrated capacitor lower polar plate contact hole 22, and the integrated capacitor upper polar contact hole 23.

In the step S20, as shown in FIG. 21, metal aluminum copper 26 is deposited on each of the tungsten bolts through a magnetron sputtering method, and an electric circuit is formed through a photoetching method and dry etching, so as to ensure that the ESD diode and the integrated capacitor are accessed into the trench type power device.

In the step S21, as shown in FIG. 22, the passivation layer 27 is deposited, and the pad region is etched through a photoetching method and dry etching, where the passivation layer 27 includes silicon nitride or silicon dioxide, then routing on a pad for packaging to complete the wire bonding, so as to complete the manufacturing method. Specifically, if the integrated capacitor is not needed here, the wire bonding may still be performed through a source pad.

Specific embodiments of the present disclosure are described above. It should be understood that the present disclosure is not limited to the specific embodiments described above, and a person skilled in the art may make various changes or modifications within the scope of the claims, which does not affect the essential content of the present disclosure. In the case of no conflict, the embodiments of the present disclosure and the features in the embodiments may be combined with each other.

What is claimed is:

1. A manufacturing method of a device integrating a trench type power device and a source capacitor, comprising:

step A, preparing a cellular structure;

step B, preparing contact holes and tungsten bolts;

step C, accessing an electro-static discharge (ESD) diode and an integrated capacitor into the trench type power device; and step D, depositing a passivation layer, etching a pad region, and performing wire bonding;

wherein the step C specifically comprises:

step S20, depositing metal aluminum copper on each of the tungsten bolts through a magnetron sputtering method, and forming an electric circuit through a photoetching method and dry etching, where a first tungsten bolt in one side of the interconnection gate contact hole distal from the two source region trench contact holes and a second tungsten bolt in one side of each of the ESD diode end contact holes distal from the two source region trench contact holes are connected through the metal aluminum copper, a third tungsten bolt in one side of each of the two source region trench contact holes, a fourth tungsten bolt in one side of each of the ESD diode end contact holes close to the two source region trench contact holes, and a fifth tungsten bolt in the integrated capacitor lower polar plate contact hole are connected through the metal aluminum copper, the metal aluminum copper is deposited above a sixth tungsten bolt in the integrated capacitor upper polar plate contact hole, so as to access the ESD diode and the integrated capacitor into the trench type power device.

2. The manufacturing method of the device integrating the trench type power device and the source capacitor according to claim 1, wherein the step A specifically comprises:

step S1, performing chemical vapor deposition on an upper surface of a silicon substrate with epitaxial layers, where each of the epitaxial layers are doped with trivalent elements and pentavalent elements;

step S2, depositing a mask on an upper surface of each of the epitaxial layers, where a component of the mask is silicon dioxide, and a preparation method of the mask comprises a low-temperature chemical vapor deposition method or a high-temperature furnace tube thermal oxidation method;

step S3, spin-coating a photoresist on an upper surface of the mask, defining trench patterns through exposure of a photoetching machine, and forming a circuit pattern on the mask, where the trench patterns comprise a lower polar plate trench pattern, a cellular gate trench pattern, and an interconnection gate trench pattern of the integrated capacitor, a critical dimension of the lower polar plate trench pattern of the integrated capacitor is greater than a critical dimension of the interconnection gate trench pattern of the integrated capacitor, and the critical dimension of the interconnection gate trench pattern of the integrated capacitor is greater than a critical dimension of the cellular gate trench pattern of the integrated capacitor;

step S4, after forming the circuit pattern on the mask, transferring the circuit pattern onto the silicon substrate through dry etching, and removing the photoresist and the mask through wet drying; performing etching to obtain a lower polar plate trench, an interconnection gate trench, and a cellular gate trench, where a depth of the lower polar plate trench is greater than a depth of the interconnection gate trench, and the depth of the interconnection gate trench is greater than a depth of the cellular gate trench;

step S5, growing a sacrificial oxide layer on a sidewall of each of the lower polar plate trench, the interconnection gate trench, and the cellular gate trench through a high-temperature furnace tube thermal oxidation method;

step S6, removing the sacrificial oxide layer through the wet etching, and growing a gate oxide layer through the high-temperature furnace tube thermal oxidation method;

step S7, depositing one layer of polysilicon on the lower polar plate trench, the interconnection gate trench, the cellular gate trench, and the silicon substrate through low-pressure chemical vapor deposition, and doping the pentavalent elements or the trivalent elements, where when the pentavalent elements are doped, the pentavalent elements are doped in a deposition process, when the trivalent elements are doped, the trivalent elements are doped through ion implantation after a gate is formed;

step S8, removing a part of the polysilicon above an upper opening of each of the lower polar plate trench, the interconnection gate trench, and the cellular gate trench through chemical mechanical polishing or the dry etching;

step S9, growing a silicon dioxide-silicon nitride-silicon dioxide composite thin film on an upper surface of the gate oxide layer or the polysilicon through the high-temperature furnace tube thermal oxidation method;

step S10, depositing one layer of intrinsic polysilicon on an upper surface of the silicon dioxide-silicon nitride-silicon dioxide composite thin film through the low-pressure chemical vapor deposition, doping a first impurity through the ion implantation, the first impurity doped through the ion implantation comprises the pentavalent elements or the trivalent elements;

step S11, defining an ESD diode region pattern and an integrated capacitor upper polar plate region circuit pattern through a photoetching method, where the ESD diode region pattern is located above the cellular gate trench and the interconnection gate trench, and the integrated capacitor upper polar plate region circuit pattern is located above the lower polar plate trench of the integrated capacitor;

step S12, transferring the ESD diode region pattern and the integrated capacitor upper polar plate region circuit pattern onto the silicon substrate through the dry etching, removing redundant silicon dioxide-silicon nitride-silicon dioxide composite thin film and redundant photoresist;

step S13, forming a transistor body region through the ion implantation by doping a second impurity, and activating the second impurity doped in the transistor body region through high-temperature thermal annealing, where the second impurity doped through the ion implantation the trivalent elements or the pentavalent elements; and step S14, simultaneously defining two transistor cellular source regions, ESD diode regions, and an integrated capacitor upper polar plate region through the photoetching method, doping a third impurity in the two transistor cellular source regions, the ESD diode regions, and the integrated capacitor upper polar plate region through the ion implantation, then removing the photoresist and activating the third impurity doped in the two transistor cellular source regions, the ESD diode regions, and the integrated capacitor upper polar plate region through the high-temperature thermal annealing to finally obtain the cellular structure, where the third impurity comprises the trivalent elements or the pentavalent elements, the two transistor cellular source regions are located at two sides of the cellular gate trench, the ESD diode regions are disposed in an ESD region at intervals, the integrated capacitor upper polar plate region is disposed on an upper surface of the silicon dioxide-silicon nitride-silicon dioxide composite thin film above the lower polar plate trench.

3. The manufacturing method of the device integrating the trench type power device and the source capacitor according to claim 2, wherein in the step S1, the step S7, the step S10, the step S13, and the step S14, the trivalent elements comprise boron element, and the pentavalent elements comprise arsenic element and phosphorus element.

4. The manufacturing method of the device integrating the trench type power device and the source capacitor according to claim 2, wherein a polarity of the third impurity doped through the ion implantation in the step S14 is opposite to a polarity of the first impurity doped through the ion implantation in the step S10, and a PN junction diode is formed in the ESD region.

5. The manufacturing method of the device integrating the trench type power device and the source capacitor according to claim 2, wherein a thickness of the sacrificial oxide layer in the step S5 is 10-100 nm, a thickness of the gate oxide layer in the step S6 is 10-100 nm; a thickness of the polysilicon in the step S7 is 500-1000 nm, and a thickness of the silicon dioxide-silicon nitride-silicon dioxide composite thin film in the step S9 is 100-2000 nm.

6. The manufacturing method of the device integrating the trench type power device and the source capacitor according to claim 1, wherein the step B specifically comprises:

step S15, forming a silicon dioxide interlayer dielectric layer through chemical vapor deposition;

step S16, configuring the photoetching method to define patterns of two source region trench contact holes, a pattern of an interconnection gate contact hole, patterns of ESD diode end contact holes, a pattern of an integrated capacitor lower polar plate contact hole, and a pattern of an integrated capacitor upper polar plate contact hole, where the contact holes comprise the two source region trench contact holes, the interconnection gate contact hole, the ESD diode end contact holes, the integrated capacitor lower polar plate contact hole, and the integrated capacitor upper polar contact hole, the patterns of the two source region trench contact holes are respectively located above the two transistor cellular source regions, the pattern of the interconnection gate contact hole is located above the interconnection gate trench, and the patterns of the ESD diode end contact holes are respectively located above two ends of each of the ESD diode regions, the pattern of the integrated capacitor lower polar plate contact hole is located above one side of the lower polar plate trench of the integrated capacitor close to the cellular gate trench, and the pattern of the integrated capacitor upper polar plate contact hole is located above the integrated capacitor upper polar plate region;

step S17, etching the silicon dioxide interlayer dielectric layer through the dry etching to transfer the patterns of the two source region trench contact holes, the pattern of the interconnection gate contact hole, the patterns of the ESD diode end contact holes, the pattern of the integrated capacitor lower polar plate contact hole, and the pattern of the integrated capacitor upper polar contact hole onto the silicon substrate;

step S18, doping a fourth impurity having high concentration to a bottom of each of the two source region trench contact holes, the interconnection gate contact hole, the ESD diode end contact holes, the integrated capacitor lower polar plate contact hole, and the integrated capacitor upper polar contact hole, forming an ohmic contact of each of the two source region trench contact holes, the interconnection gate contact hole, the ESD diode end contact holes, the integrated capacitor lower polar plate contact hole, and the integrated capacitor upper polar contact hole through activating the fourth impurity through rapid thermal annealing; and step S19, depositing metal titanium at the bottom of each of the two source region trench contact holes, the interconnection gate contact hole, the ESD diode end contact holes, the integrated capacitor lower polar plate contact hole, and the integrated capacitor upper polar contact hole through a physical vapor deposition method, configuring titanium nitride as a bounding layer, forming silicide through rapid thermal degradation, then depositing metal tungsten, removing a part of the metal tungsten other than the two source region trench contact holes, the interconnection gate contact hole, the ESD diode end contact holes, the integrated capacitor lower polar plate contact hole, and the integrated capacitor upper polar contact hole through the dry etching, and forming each of the tungsten bolts in each of the two source region trench contact holes, the interconnection gate contact hole, the ESD diode end contact holes, the integrated capacitor lower polar plate contact hole, and the integrated capacitor upper polar contact hole.

7. The manufacturing method of the device integrating the trench type power device and the source capacitor according to claim 6, wherein a polarity of the fourth impurity doped through the ion implantation in the step S18 is same as a polarity of the second impurity doped through the ion implantation in the step S13.

8. The manufacturing method of the device integrating the trench type power device and the source capacitor according to claim 1, wherein the step D specifically comprises:

step S21, depositing the passivation layer, and etching the pad region through a photoetching method and dry etching, where the passivation layer comprises silicon nitride or silicon dioxide.

9. A device integrating a trench type power device and a source capacitor, wherein the device integrating the trench type power device and the source capacitor is obtained through the manufacturing method of the device integrating the trench type power device and the source capacitor according to claim 1.

\* \* \* \* \*